United States Patent [19]

Schmitz

[11] Patent Number: 4,888,496
[45] Date of Patent: Dec. 19, 1989

[54] CIRCUITRY FOR ADJUSTING THE AMPLITUDE OF ANALOG SIGNALS

[75] Inventor: Friedrich Schmitz, Villingen-Schwenningen, Fed. Rep. of Germany

[73] Assignee: Deutsche Thomson-Brandt GmbH, Fed. Rep. of Germany

[21] Appl. No.: 240,910

[22] Filed: Sep. 7, 1988

[30] Foreign Application Priority Data

Sep. 19, 1987 [DE] Fed. Rep. of Germany ....... 3731643

[51] Int. Cl.$^4$ .......................... H03K 5/02; H03K 5/08; H03K 17/16
[52] U.S. Cl. ..................................... 307/264; 307/358; 307/494; 307/542; 328/165; 328/168
[58] Field of Search ............... 307/242, 264, 358, 359, 307/353, 540, 542, 572, 584, 491, 493, 494, 520; 328/162, 163, 165, 168, 169; 381/94, 104, 123

[56] References Cited

U.S. PATENT DOCUMENTS

| | | | |
|---|---|---|---|
| 3,819,953 | 6/1974 | Puckette et al. | 307/353 |
| 3,851,260 | 11/1974 | Colin | 307/353 |
| 4,716,321 | 12/1987 | Erratico | 307/264 |

FOREIGN PATENT DOCUMENTS 2091054 7/1982 United Kingdom ................ 307/264

Primary Examiner—John Zazworsky
Attorney, Agent, or Firm—Joseph S. Tripoli; Eric P. Herrmann; James B. Hayes

[57] ABSTRACT

In an audio signal amplitude control circuit of the type including a tapped resistive divider to which the signal is applied, and a multiplexer for selecting one of a plurality of differently attenuated signals from said taps responsive to control signals, the selected signal will include switching transients due to capacitive coupling with the control signals. The switching transients are substantially eliminated by including a second tapped resistive divider to which antiphase input signal is applied, and a second multiplexer coupled to the taps of the second divider. Output signals from the multiplexer and second multiplexer are coupled to a differential amplifier which cancels the switching transients generated by the two multiplexers and constructively combines the useful signal components from the two multiplexers.

6 Claims, 2 Drawing Sheets

CIRCUITRY FOR ADJUSTING THE AMPLITUDE OF ANALOG SIGNALS

This invention relates to circuitry for stepwise controlling the amplitude of analog signals (e.g. audio signals) of the type employing electronic switches to select taps of a resistor chain.

BACKGROUND OF THE INVENTION

It is known in the audio signal processing art to adjust sound volume by applying the audio signal to a tapped resistor divider and to select, as output signal, signal from one of the taps using a transistor switch arrangement. Typically the transistor switch arrangement is realized with an array of metal-oxide-semiconductor field effect transistors (MOS-FET's) or complementary MOS-FET's i.e. CMOS-FET's. With this arrangement it is possible to achieve a coarse and fine adjustment e.g. a level adjustment from zero to −110 db, in steps of arbitrary width, e.g. in steps of two db. The CMOS-switches however have a detrimental property, which results in the generation of clearly audible clicks at each change of level. The clicks are developed for several reasons. The CMOS-switch arrangement is constructed in integrated circuit form, consisting of e.g. field effect transistors (FET) controlled by binary codewords for enabling selected ones of the transistors. The switching transistors possess unavoidable stray capacitances between the respective control or gate electrodes and the source-drain-electrodes. Also the switching transistors contain capacitances coupled between the logic circuitry which decodes the binary control-code into transistor gate control signals. There also exists unwanted capacitances between the supply voltage bus, ground and the signal path. Because of the existence of these capacitances, during incremental adjustments of the signal amplitude by selectively sequentially enabling a succession of MOS-FET switches, a series of narrow voltage spikes are imposed on the audio signal. These spikes result from the transitions of the transistor control signals being capacitively coupled to the signal path. The spikes have a magnitude approaching the magnitude of the supply potential. Even if the voltage spikes have a duration in the range of microseconds, they will be integrated by the low pass effect of the audio output amplifier, as well as the physiology of the human ear, to produce an audible clicking in the reproduced sound.

It is an object of the invention to provide a switched audio amplitude control system free of disturbing clocking noises.

SUMMARY OF THE INVENTION

The present invention is a circuit arrangement for the amplitude adjustment of analog signals using a tapped impedance and transistor multiplexers. Input signal is applied to one end of the tapped impedance and respective input connections of a first transistor multiplexer are coupled to respective ones of the taps. The output of the first transistor multiplexer is coupled to one input connection of a differential amplifier. A second transistor multiplexer, similar to said first transistor multiplexer has its output coupled to a second input connection of the differential amplifier. Like control and supply signals are applied to both multiplexors whereby said first and second multiplexers produce similar switching transients which are cancelled in the differential amplifier.

DETAILED DESCRIPTION

Figure 1:
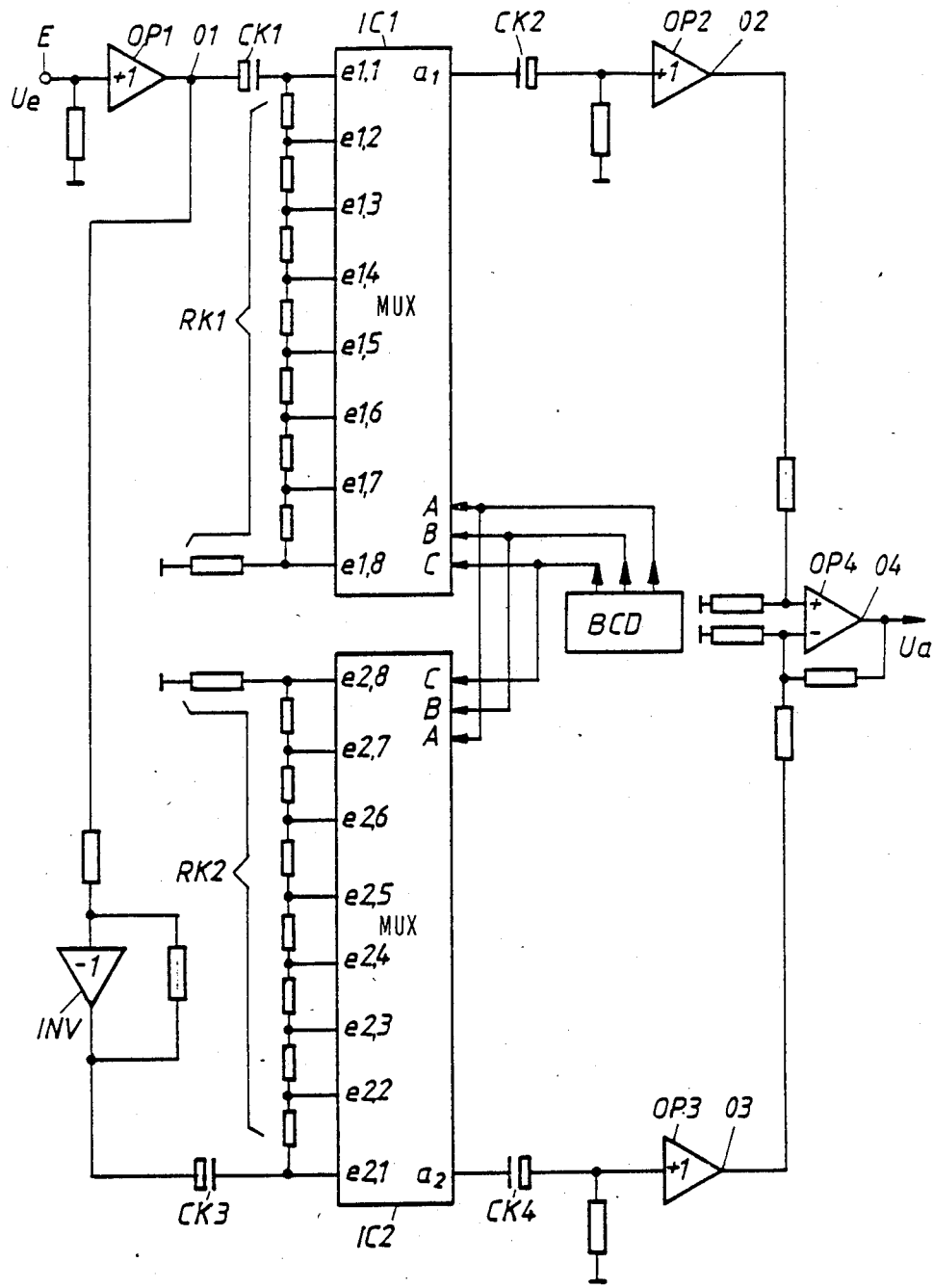
FIG. 1 is a block diagram of amplitude control circuitry embodying the invention employing separate transistor multiplexers.

In FIG. 1 an input signal Ue which is to be amplified and adjusted, is applied to an input connection E of an operational amplifier OP1. The output O1 of the amplifier OP1 is coupled, via a coupling capacitor CK1, to a tapped impedance realized as the resistor chain RK1. The taps of this resistor chain RK1 are coupled to the inputs e1,1 to e1,8 of the CMOS switching circuit or transistor multiplexer IC1. The latter has e.g. three control inputs A, B and C for applying binary codes for selectively connecting the respective inputs e1,1 to e1,8 to the output a1. Signal from the output connection a1 is applied to the operational amplifier OP2 via a coupling capacitor CK2. The circuit so far described is known. Useful signal contaminated with the afore described switching transients is available at the output O2 of the amplifier OP2.

The remaining circuitry contained in FIG. 1 serves to perform the object of the invention.

A second CMOS switching circuit IC2 similar to IC1 is arranged in parallel with CMOS switching circuit IC1. The input connections e2,1 to e2,8 are coupled to the taps of a tapped impedance realized as a resistor chain RK2 which is similar to resistor chain RK1. The output signal provided by amplifier OP1 is inverted in amplifier INV and coupled, via capacitor CK3 to the end of the resistor chain RK2. Signal from the output terminal a2 of CMOS switching circuit IC2 is coupled, via capacitor CK4, to an amplifier OP3. The control input terminals A, B, and C of the CMOS switching circuit IC2 are connected in parallel with the control input terminals A, B and C of the CMOS switching circuit IC1. The respective output connections O2 and O3 of amplifiers OP2 and OP3 are respectively coupled to the noninverting and inverting input terminals of a differential amplifier OP4. Amplifier OP4 provides at its output connection O4, amplitude adjusted input signal, Ua, substantially free of switching transients generated by the amplitude control circuitry. The transients are eliminated for the following reason. Circuits IC1,RK1 and IC2,RK2, being similar and connected in parallel, develop similar switching transients at their respective output terminals, which transients are in phase. The differencing operation of differential amplifier OP4 cancels the in-phase transients. The useful signals coupled to the respective circuits IC1,RK1 and IC2,RK2 are equal in magnitude but of opposite phase. Therefore the useful signal components provided at the output connections a1 and a2 are of equal magnitude but opposite phase. The differencing operation of amplifier OP4 constructively combines the out of phase signals. In addition if the circuitry IC1,RK1 is the dominant random noise source of an amplitude adjusting circuit, the parallel combination of two such circuits as in FIG.

1 provides a signal-to-noise ratio improvement approaching 3 db.

Figure 2:
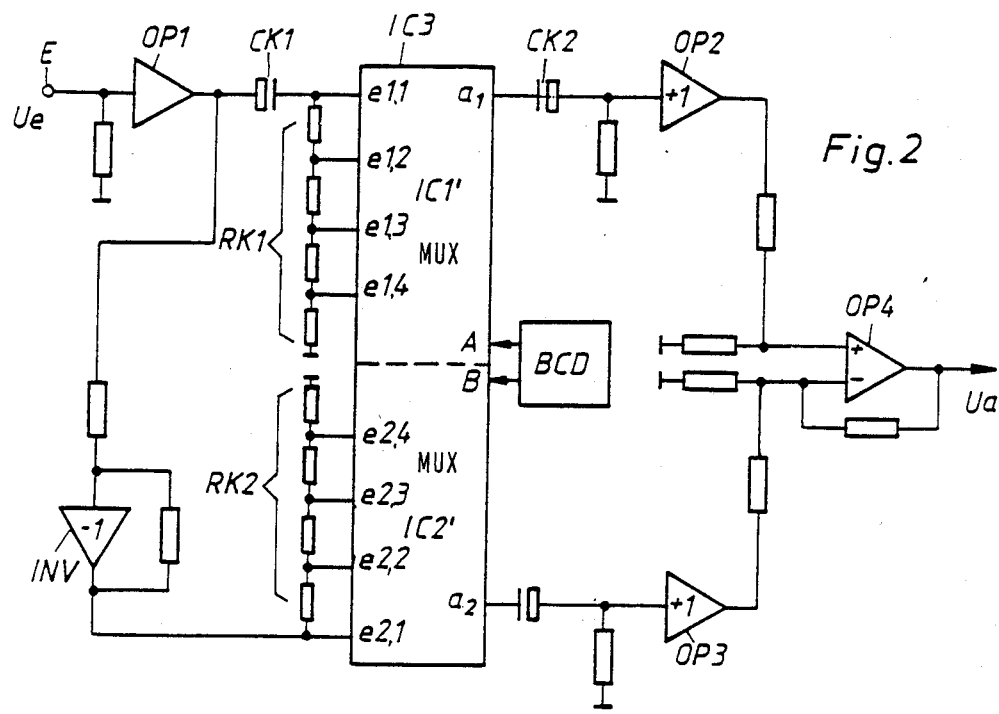
FIG. 2 is a block diagram of amplitude control circuitry embodying the invention employing first and second transistor multiplexers realized on a signal integrated circuit.
Figure 3:
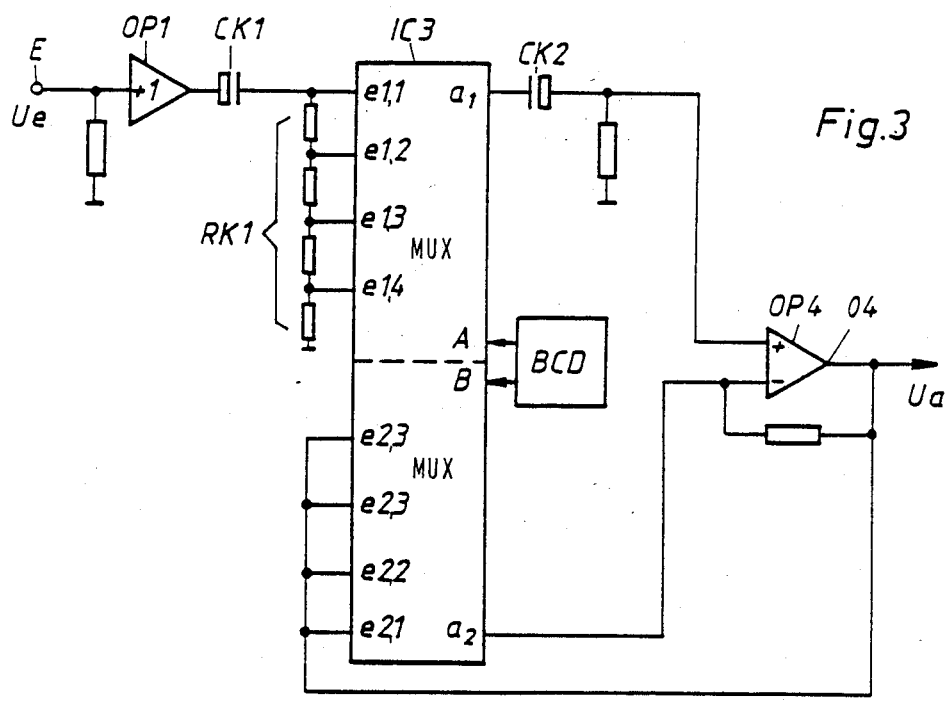
FIG. 3 is a block diagram of alternate amplitude control circuitry embodying the invention.

The compensation of disturbances is only optimal, when the circuits IC1 and IC2 produce exactly equal transients. This however is not always realized if the circuits for example are arranged from circuit devices contained in different packages or IC's. An improved version of the invention follows therefore, if the two circuits IC1 and IC2 are arranged on the same integrated circuit die. This circuit is shown in FIG. 2, in which the same terms of FIG. 1 are used. The example shows a circuit IC3, which has two control inputs A and B and the resistor chains RK1 and RK2 between the inputs e1,1 to e1,4 and e2,1 to e2,4, which contains four resistors each. By connecting two of the FIG. 2 circuits in cascade it is possible to preserve the same range of level adjustments. In FIG. 3 a further possibility is shown to eliminate said disturbing interference pulses. While the upper half of FIG. 3 corresponds basically with the upper half of FIG. 2, the lower half differs. The inputs e2,1 to e2,4 of the second multiplexer are coupled to the output 04 of the operational amplifier OP4. In this arrangement the useful signal is available at only one input of the difference amplifier OP4 which precludes the signal-to-noise ratio improvement but advantageously eliminates the need for operational amplifiers OP2, OP3 and the inverter stage INV.

For the CMOS-switches designated IC1, IC2 and IC3 the following integrated circuit types may be used for example MC 14051, and 14052 which are available from Motorola Semiconductor Products Inc., Austin, Tex.

What is claimed is:

1. In circuitry, for controlling the amplitude of an analog signal, of the type including a tapped impedance to which an analog input signal is applied, and a first multiplexer having a plurality of input terminals coupled to respective ones of taps of said tapped impedance, said first multiplexer responsive to control signals for selectively coupling ones of its input terminals to an output terminal thereof to provide an amplitude controlled signal, said circuitry including an improvement comprising:
    means for subtractively combining two signals having a first input terminal coupled to the output terminal of said first multiplexer, having a second input terminal, and an output terminal for providing amplitude controlled signal;
    a second multiplexer similar to said first multiplexer, having an output terminal coupled to said second input terminal of said means for subtractively combining two signals, said second multiplexer responsive to said control signals for selectively coupling one of its input terminals to its output terminal in like manner to said first multiplexer.

2. The circuitry set forth in claim 1 wherein said first and second multiplexers are contained in a single integrated circuit.

3. In circuitry, for controlling the amplitude of an analog signal, of the type including a tapped impedance to which an analog input signal is applied, and a first multiplexer having a plurality of input terminals coupled to respective ones of taps of said tapped impedance, said first multiplexer responsive to control signals for selectively coupling ones of its input terminals to an output terminal thereof to provide an amplitude controlled signal, said circuitry including an improvement comprising:
    means for subtractively combining two signals having a first input terminal coupled to the output terminal of said first multiplexer, having a second input terminal, and an output terminal for providing amplitude controlled signal;
    a second multiplexer similar to said first multiplexer, having an output terminal coupled to said second input terminal of said means for subtractively combining two signals, said second multiplexer responsive to said control signals for selectively coupling one of its input terminals to its output terminal in like manner to said first multiplexer;
    a further tapped impedance having output taps coupled to respective input terminals of said second multiplexer; and
    means for coupling said analog input signal to said further tapped impedance in an anti phase relationship to which said analog input signal is applied to said tapped impedance.

4. The circuitry set forth in claim 3 wherein said first and second multiplexers are contained in a single integrated circuit.

5. In circuitry, for controlling the amplitude of an analog signal, of the type including a tapped impedance to which an analog input signal is applied, and a first multiplexer having a plurality of input terminals coupled to respective ones of taps of said tapped impedance, said first multiplexer responsive to control signals for selectively coupling ones of its input terminals to an output terminal thereof to provide an amplitude-controlled signal, said circuitry including an improvement comprising:
    means for subtractively combining two signals having a first input terminal coupled to the output terminal of said first multiplexer, having a second input terminal, and an output terminal for providing amplitude controlled signal;
    a second multiplexer similar to said first multiplexer, having an output terminal coupled to said second input terminal of said means for subtractively combining two signals, said second multiplexer responsive to said control signals for selectively coupling one of its input terminals to its output terminal in like manner to said first multiplexer; and
    means for coupling the output terminal of said means for subtractively combining two signals, to an input terminal of said second multiplexer.

6. The circuitry set forth in claim 5 wherein said first and second multiplexers are contained in a single integrated circuit.

* * * * *